United States Patent
Chen et al.

(10) Patent No.: US 9,257,039 B2
(45) Date of Patent: Feb. 9, 2016

(54) METHOD FOR DETECTING TIME SYNCHRONIZATION ABILITY OF REAL-TIME MEASURING DEVICE BASED ON TIME VARIABLE

(71) Applicants: STATE GRID CORPORATION OF CHINA, Beijing (CN); STATE GRID HUBEI ELECTRIC POWER RESEARCH INSTITUTE, Wuhan, Hubei (CN)

(72) Inventors: Hong Chen, Hubei (CN); Yongjun Xia, Hubei (CN); Yuehai Yu, Hubei (CN); Gang Hu, Hubei (CN); Yong Cai, Hubei (CN); Jin Wang, Hubei (CN); Qian Tao, Hubei (CN)

(73) Assignees: STATE GRID CORPORATION OF CHINA, Beijing (CN); STATE GRID HUBEI ELECTRIC POWER RESEARCH INSTITUTE, Wuhan, Hubei (CN)

( * ) Notice: Subject to any disclaimer, the term of this patent is extended or adjusted under 35 U.S.C. 154(b) by 137 days.

(21) Appl. No.: 14/239,769

(22) PCT Filed: Nov. 23, 2012

(86) PCT No.: PCT/CN2012/085143
§ 371 (c)(1),
(2) Date: Apr. 29, 2014

(87) PCT Pub. No.: WO2013/135069
PCT Pub. Date: Sep. 19, 2013

(65) Prior Publication Data
US 2014/0240145 A1  Aug. 28, 2014

(30) Foreign Application Priority Data
Mar. 14, 2012  (CN) .......................... 2012 1 0066201

(51) Int. Cl.
*G08C 19/24* (2006.01)
*H02J 13/00* (2006.01)
(Continued)

(52) U.S. Cl.
CPC ............ *G08C 19/24* (2013.01); *G01R 19/2513* (2013.01); *H02J 13/00* (2013.01); *G04G 7/00* (2013.01)

(58) Field of Classification Search
CPC ...... G01R 19/2513; G04G 7/00; G08C 19/24; H02J 13/00
USPC ....................................................... 340/870.25
See application file for complete search history.

(56) References Cited

U.S. PATENT DOCUMENTS 3,701,940 A * 10/1972 Bruno Yngve
                                 Nilsson .................... G01V 3/06
                                                               324/357
5,027,040 A *  6/1991 Ikeda ...................... H05B 33/08
                                                               315/169.3

(Continued)

FOREIGN PATENT DOCUMENTS

| CN | 101043317 | 9/2007 |
|----|-----------|--------|
| CN | 101604142 | 12/2009 |

(Continued)

*Primary Examiner* — Omer S Khan (57) ABSTRACT

A method for detecting a time synchronization ability of the real-time measuring device based on a time variable is provided. On a premise that the real-time measuring device correctly receives time service signals, the method aims at detecting time synchronization signal application ability of the real-time measuring device, and involves a purely resistive loop comprising a value transferring device and a time controllable switch. The method, via a time synchronization performance thereof, relatively completely reflects the time synchronization signal application ability of the device within a value transfer requirement. The method is a development upon power station time synchronization time service signals and transmission accuracy detection and an improvement of power station time synchronization detection procedures. The method facilitates improving real-time analysis and monitoring abilities of a power station and a power grid to a primary device and a primary system.

3 Claims, 4 Drawing Sheets

(51) Int. Cl.
 *G01R 19/25* (2006.01)
 *G04G 7/00* (2006.01)

(56) References Cited

U.S. PATENT DOCUMENTS

| | | | |
|---|---|---|---|
| 7,945,401 B2 | 5/2011 | Bowdry et al. | |
| 2008/0061765 A1* | 3/2008 | Arnoux | G01R 13/02 324/76.39 |
| 2009/0248327 A1* | 10/2009 | Montanari | G01R 31/1227 702/58 |
| 2009/0326731 A1* | 12/2009 | Bowdry | G01D 4/004 700/297 |
| 2013/0141278 A1* | 6/2013 | Rao | G01S 19/02 342/357.44 |
| 2013/0204450 A1* | 8/2013 | Kagan | H04L 67/06 700/291 |

FOREIGN PATENT DOCUMENTS

| | | |
|---|---|---|
| CN | 101957593 | 1/2011 |
| CN | 202041788 | 11/2011 |
| CN | 102590619 | 7/2012 |

\* cited by examiner

METHOD FOR DETECTING TIME SYNCHRONIZATION ABILITY OF REAL-TIME MEASURING DEVICE BASED ON TIME VARIABLE

CROSS REFERENCE OF RELATED APPLICATION

This is a U.S. National Stage under 35 U.S.C 371 of the International Application PCT/CN2012/085143, filed Nov. 23, 2012, which claims priority under 35 U.S.C. 119(a-d) to CN 201210066201.2, filed Mar. 14, 2012.

BACKGROUND OF THE PRESENT INVENTION

1. Field of Invention

The present invention relates to a power device detection method, and more particularly to a method for detecting a time synchronization ability of a real-time measuring device based on a timing variable, wherein the method detects a time synchronization signal application ability of the real-time measuring device through a measuring function of an electric real-time measuring device of a power station, on a basis of a manner of controlling breaking values of alternating signals and switch value signals at a designated time.

2. Description of Related Arts

In recent years, the improvement of the electronic equipment manufacture technology, the popularization and application of the satellite time service technology, and the establishment and perfection of the time synchronization technological standard in the power industry, all support the automation technology development of the regional power grid and the transformer substation, maintain the operation safety of the power grid, improve the real-time analyzing, judging and processing abilities about the power grid operation, and facilitate the effective implement of the unattended operational mode of the transformer substation is facilitated.

The physical time synchronization of the power station including the transformer substation and the switch field of the power plant, refers to the synchronization of functions of each Intelligent Electronic Device (IED) within the power station in a narrow sense; and refers to the synchronization of the functions of the related IEDs of each power station within a region in a broad sense. The inconsistency in the time synchronization of the power station IEDs causes the incorrect time sequence of the non-local/local real-time records and the illogical fault analysis which frequently exist in the power system, and affects the abilities of the power grid which include the real-time sample and analysis, the real-time manipulation and control, the precise fault judgment and the timely accident solution.

The electric secondary IEDs for real-time measuring and analyzing faults in the power station, such as the fault recorder and the Phasor Measurement Unit (PMU), mostly have the functions of real-time measuring the alternating quantity input and the switch value input; the time accuracy of the real-time records is usually required to reach the time synchronization level at milliseconds or at microseconds.

Based on the structure of the power station time synchronization system, according to the application site and the detection situations, the correctness of the IEDs time synchronization is mainly controlled by the three links including the time service device within the power station, the transmission of the synchronization time service signal and the time-seeking application of the IEDs which is the application correctness of the IEDs to the synchronization signals. Because the current technological standard has basically satisfied the normal application and detection of the former two links, apparently, detecting the time-seeking application of the IEDs becomes the key factor, also the spot where the on-site time synchronization problems frequently occur and the technological difficulty.

Most of the conventional on-site engineering applications aimed at detecting the IED time synchronization ability, adopt the qualitative validation manner of mutual verification according to the logical correlations among the device functions. The ultimate purpose of the power station time synchronization is to accomplish the IED function time synchronization of the power primary devices; in other words, the time section of the measurement and control of the primary devices is supposed to be determined, and real-time analyzing and monitoring the primary devices and the primary system by the power station and the power grid is supposed to be supported through the IED time synchronization. Thus the time synchronization ability of the IEDs is confirmed by the source-traceable time quantitative detection method through each function of the IEDs, based on the engineering technological principle of the source validation.

The Chinese patent 200820067196.6, controllable time scale signal source, and the Chinese patent 200810047989.6, method for detecting time information of output signals of satellite synchronization time service device, disclosed the conventional time controllable switch. Based on the mature application of the time controllable switch, combined with the alternating electricity principle of the purely resistive loop, a method for detecting the time synchronization ability of the real-time measuring device based on a time variable is provided.

SUMMARY OF THE PRESENT INVENTION

An object of the present invention is to provide a method for detecting a time synchronization ability of a real-time measuring device based on a time variable, the method comprising steps of: changing an alternating input signal intensity and a switch input signal status of a power grid real-time measuring device at a designated time, comparing a datum of a signal variable time with a breaking time value which is recorded by the power grid real-time measuring device, and detecting an ability to apply a time synchronization signal of the real-time measuring device.

A method for detecting a time synchronization ability of a real-time measuring device based on a time variable, comprises a step of: in order to detect a time synchronization capability of a measurement function of a real-time measuring device, providing a system which comprises a real-time measuring device, a standard satellite synchronous time service device, a multi-channel storage oscilloscope, an AC source and a controllable time scale signal source; the step of providing the system specifically comprises:

respectively connecting two satellite signal antennae into the standard satellite synchronous time service device and the controllable time scale signal source; connecting a time synchronous signal TOUT output terminal of the standard satellite synchronous time service device to a time synchronous signal TIN input terminal of the real-time measuring device; connecting a pulse 1 pps signal POUT output terminal of the standard satellite synchronous time service device to a first sampling channel CH1 of the oscilloscope; connecting an output terminal of a time controllable switch for detecting a switch value SDC of the controllable time scale signal source to a switch value DI input terminal of the real-time measuring device and a second sampling channel CH2 of the oscilloscope in parallel; forming a purely resistive alternating detection loop by connecting a first output terminal of an AC source output interface ÃO to a first purely resistive element, an alternating current ĨAI input channel of the real-time measuring device, a second purely resistive element and a second output terminal of the AC source output interface ÃO in series; across the first purely resistive element, connecting an alternating voltage ŨAI input channel of the real-time measuring device and a third sampling channel CH3 of the oscilloscope to two ends of the first purely resistive element; connecting an output terminal of a time controllable switch for detecting an alternating quantity SAC of the controllable time scale signal source and a fourth sampling channel CH4 of the oscilloscope in parallel, and then across the second purely resistive element connecting the output terminal of the time controllable switch for detecting an alternating quantity SAC and the fourth sampling channel CH4 to two ends of the second purely resistive element.

The method further comprises a step of: detecting a time synchronization deviation of an alternating voltage measurement (t2−T2) and a time synchronization deviation of an alternating current measurement (t3−T2) of a to-be-detected alternating quantity time synchronization measuring ability, which specifically comprises:

(step 61) confirming that the first sampling channel CH1 of the oscilloscope normally receives and detects a reference standard pulse 1 pps signal, and checking that a human-machine interface (HMI) of the real-time measuring device normally confirms and receives the time synchronization signal TIN;

(step 62) setting the second sampling channel CH2 of the oscilloscope as a triggering channel;

(step 63) setting a detection time T, by the controllable time scale signal source, to be at a sharp minute or at a sharp second when the time controllable switch for detecting the switch value SDC and the time controllable switch for detecting the alternating quantity SAC act simultaneously to initiate the controllable time scale signal source;

(step 64) waiting until T;

(step 65) at T, acting and triggering the oscilloscope to lock a screen display thereof by the controllable switch SDC, wherein the oscilloscope is displaying a status of each sampling channel at T, and capturing a pulse rising edge of the reference standard pulse 1 pps signal at T according to the second sampling channel CH2 by the first sampling channel CH1;

(step 70) through the first sampling channel CH1, obtaining a voltage breaking absolute time of the two ends of the first purely resistive element T2=T+ΔT2 which is captured by the third sampling channel CH3, and also a voltage breaking absolute time of the two ends of the second purely resistive element T2=T+ΔT2 which is captured by the fourth sampling channel CH4, wherein ΔT2 is a time deviation of the acting of the switch SAC from T; according to a principle of the purely resistive loop, obtaining signal breaking absolute times of the alternating voltage ŨAI measuring signal input terminal and the alternating current ĨAI measuring signal input terminal T2=T+ΔT2;

(step 71) recording a breaking time of an alternating voltage ŨAI input signal t2=T+Δt2 by the HMI of the real-time measuring device, wherein Δt2 is a time deviation of an alternating voltage ŨAI breaking time which is recorded by the real-time measuring device from T; and recording a breaking time of an alternating current ĨAI input signal t3=T+Δt3 by the HMI, wherein Δt3 is a time deviation of an alternating current ĨAI breaking time which is recorded by the real-time measuring device from T; and (step 72) obtaining a time synchronization deviation of the alternating quantity measurement of the real-time measuring device, wherein the time synchronization deviation of the alternating voltage measurement t2−T2=Δt2−ΔT2 and that of the alternating current measurement t3−T2=Δt3−ΔT2.

The method further comprises a step of: detecting a time synchronization deviation of a time synchronization deviation of a switch value measurement (t1−T1) of the to-be-detected switch value time synchronization measuring ability, which specifically comprises:

(step 61) confirming that the first sampling channel CH1 of the oscilloscope normally receives and detects a reference standard pulse 1 pps signal, and checking that a human-machine interface (HMI) of the real-time measuring device normally confirms and receives the time synchronization signal TIN;

(step 62) setting the second sampling channel CH2 of the oscilloscope as a triggering channel;

(step 63) setting a detection time T, by the controllable time scale signal source, to be at a sharp minute or at a sharp second when the time controllable switch for detecting the switch value SDC and the time controllable switch for detecting the alternating quantity SAC act simultaneously to initiate the controllable time scale signal source;

(step 64) waiting until T;

(step 65) at T, acting and triggering the oscilloscope to lock a screen display thereof by the controllable switch SDC, wherein the oscilloscope is displaying a status of each sampling channel at T, and capturing a pulse rising edge of the reference standard pulse 1 pps signal at T according to the second sampling channel CH2 by the first sampling channel CH1;

(step 67) through the first sampling channel CH1 and the second sampling channel CH2, obtaining an absolute time T1=T+ΔT1 when the time controllable switch for detecting the switch value SDC and the switch value DI measuring signal input terminal change the statuses, wherein ΔT1 is a time deviation of the acting of the switch SDC from T;

(step 68) recording a time at which the switch value DI input signal changes the status t1=T+Δt1 by the HMI of the real-time measuring device, wherein Δt1 is a time deviation of the switch value DI status changing time which is recorded by the real-time measuring device from T; and (step 69) obtaining the time synchronization deviation of the switch value measurement of the real-time measuring device t1−T1=Δt1−ΔT1.

According to the controllable switch application principles disclosed by the Chinese patent 200820067196.6, controllable time scale signal source, and the Chinese patent 200810047989.6, method for detecting time information of output signals of satellite synchronization time service device, on a premise that the real-time measuring device correctly receives time service signals, the present invention provides the method for detecting the time synchronization ability of the power station real-time measuring device based on a control of the variable time, wherein the method involves the purely resistive loop comprising a value transferring device and a time controllable switch and aims at a detection purpose of the time synchronization signal application ability of the real-time measuring device.

The method provided by the present invention covers the switch value and the alternating voltage/current input channels of the measurement function of the real-time measuring device, and relatively completely reflects the time synchronization signal application ability of the device while satisfying a requirement of value transfer. The method provided by the present invention is an improvement on a basis of the power station time synchronization time service signals and the transmission accuracy detection; the method improves power station time synchronization detection procedures and facilitates improving the real-time analysis and monitoring abilities of the power station and the power grid to the primary device and the primary system.

These and other objectives, features, and advantages of the present invention will become apparent from the following detailed description, the accompanying drawings, and the appended claims.

1—real-time measuring device; 2—standard satellite synchronous time service device; 3—oscilloscope; 4—AC source; 5—controllable time scale signal source; 6—first purely resistive element; 7—second purely resistive element; 9, 10—satellite signal antennae; 11—time synchronization signal input terminal; 12—switch value DI measuring signal input terminal; 13—alternating voltage $\tilde{U}AI$ measuring signal input terminal; 14—alternating current $\tilde{I}AI$ measuring signal input terminal; 15—HMI; 21—time synchronization signal output terminal; 22—pulse 1 pps signal output terminal; 31—first sampling channel CH1; 32—second sampling channel CH2; 33—third sampling channel CH3; 34—fourth sampling channel CH4; 41—first output terminal of AC source output interface $\tilde{A}O$; 42—second output terminal of AC source output interface $\tilde{A}O$; 51—time controllable switch for detecting switch value SDC; 52—time controllable switch for detecting alternating quantity SAC; 61—first common step of detection methods; 62—second common step of detection methods; 63—third common step of detection methods; 64—fourth common step of detection methods; 65—fifth common step of detection methods; 66—sixth common step of detection methods; 67—first step for switch value detection; 68—second step for switch value detection; 69—third step for switch value detection; 70—first step for alternating quantity detection; 71—second step for alternating quantity detection; 72—third step for alternating quantity detection; 73—final detection step; T—detection initiating time and rising edge of 1 pps pulse of reference standard POUT thereof set by controllable time scale signal source; T1—actual acting time of time controllable switch SDC; $\Delta T1$—time deviation of acting of switch SDC from T; t1—status changing time of switch value DI recorded by real-time measuring device; $\Delta t1$—time deviation of status changing time of switch value DI recorded by real-time measuring device from T; T2—actual acting time of time controllable switch SAC; $\Delta T2$—time deviation of acting time of switch SAC from T; t2—alternating voltage $\tilde{U}AI$ breaking time recorded by real-time measuring device; $\Delta t2$—time deviation of recorded alternating voltage $\tilde{U}AI$ breaking time of real-time measuring device from T; t3—alternating current $\tilde{I}AI$ breaking time recorded by real-time measuring device; $\Delta t3$—time deviation of recorded alternating current $\tilde{I}AI$ breaking time of real-time measuring device from T; (t1−T1)—time synchronization deviation of switch value measurement of real-time measuring device; (t2−T2)—time synchronization deviation of alternating voltage measurement of real-time measuring device; and (t3−T2)—time synchronization deviation of alternating current measurement of real-time measuring device.

DETAILED DESCRIPTION OF THE PREFERRED EMBODIMENT

Combined with the drawings, the technical solutions of the present invention are clearly and wholly illustrated as follows.

Figure 1:
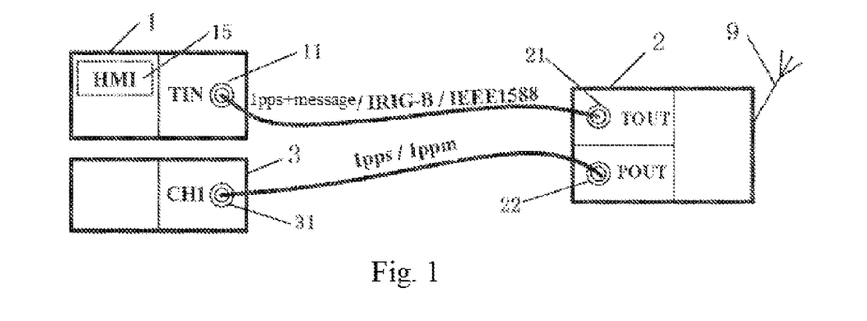
FIG. 1 is a sketch view of connections of a time synchronization signal loop according to a preferred embodiment of the present invention.
Figure 2:
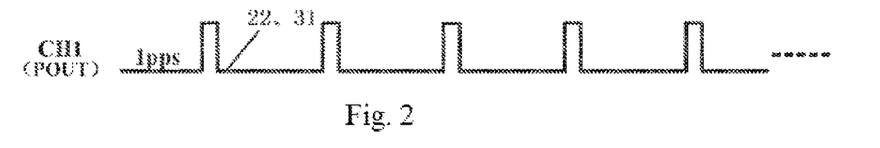
FIG. 2 is a sketch view of a waveform of a reference standard time synchronization pulse according to the preferred embodiment of the present invention.
Figure 3:
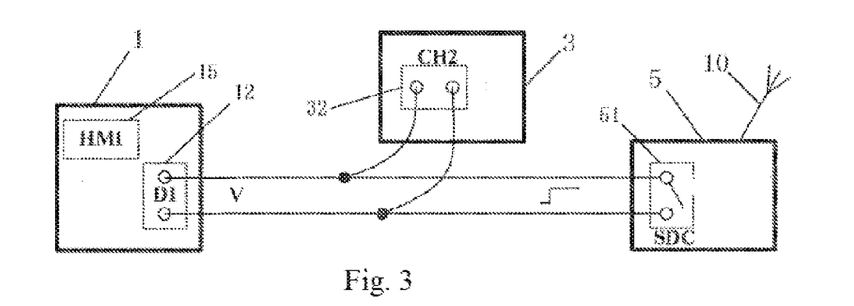
FIG. 3 is a sketch view of connections of a time synchronization detection loop of a switch value measurement according to the preferred embodiment of the present invention.
Figure 4:
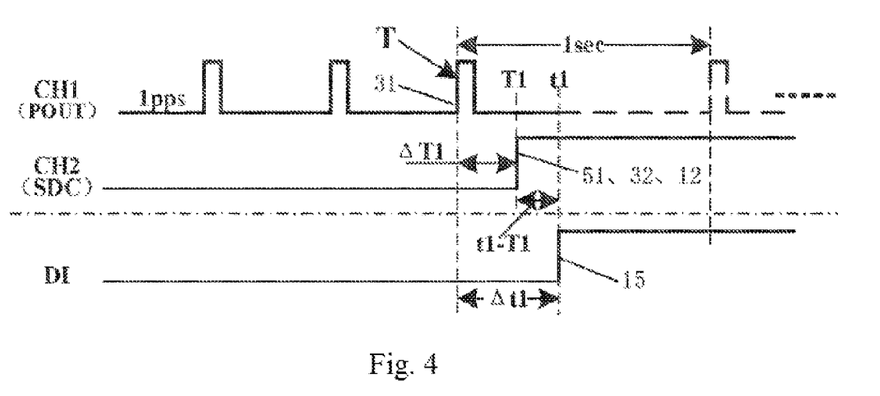
FIG. 4 is a sketch view of a time synchronization detection waveform of the switch value measurement according to the preferred embodiment of the present invention.
Figure 5:
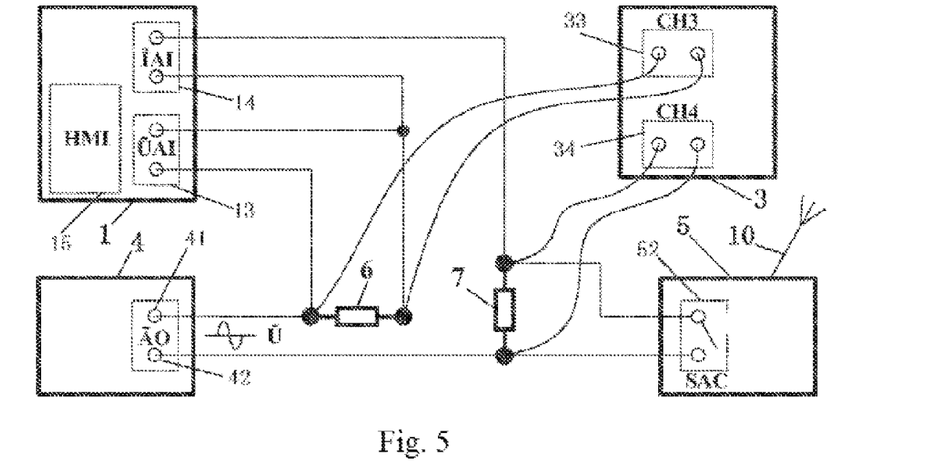
FIG. 5 is a sketch view of connections of a time synchronization detection loop of an alternating quantity measurement according to the preferred embodiment of the present invention.
Figure 6:
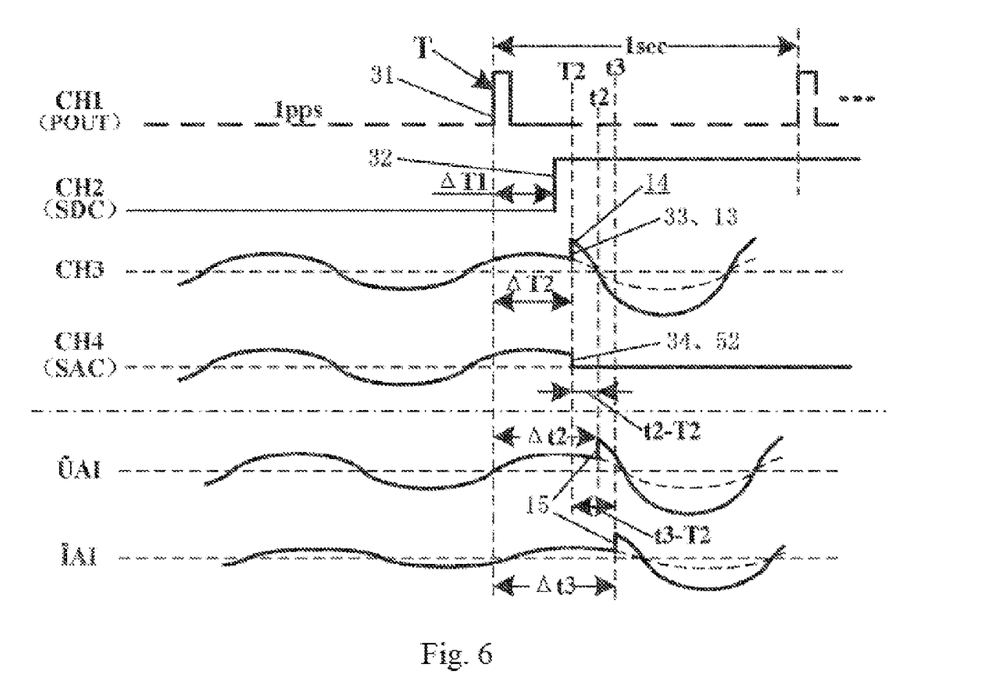
FIG. 6 is a sketch view of a time synchronization detection waveform of the alternating quantity measurement according to the preferred embodiment of the present invention.
Figure 7:
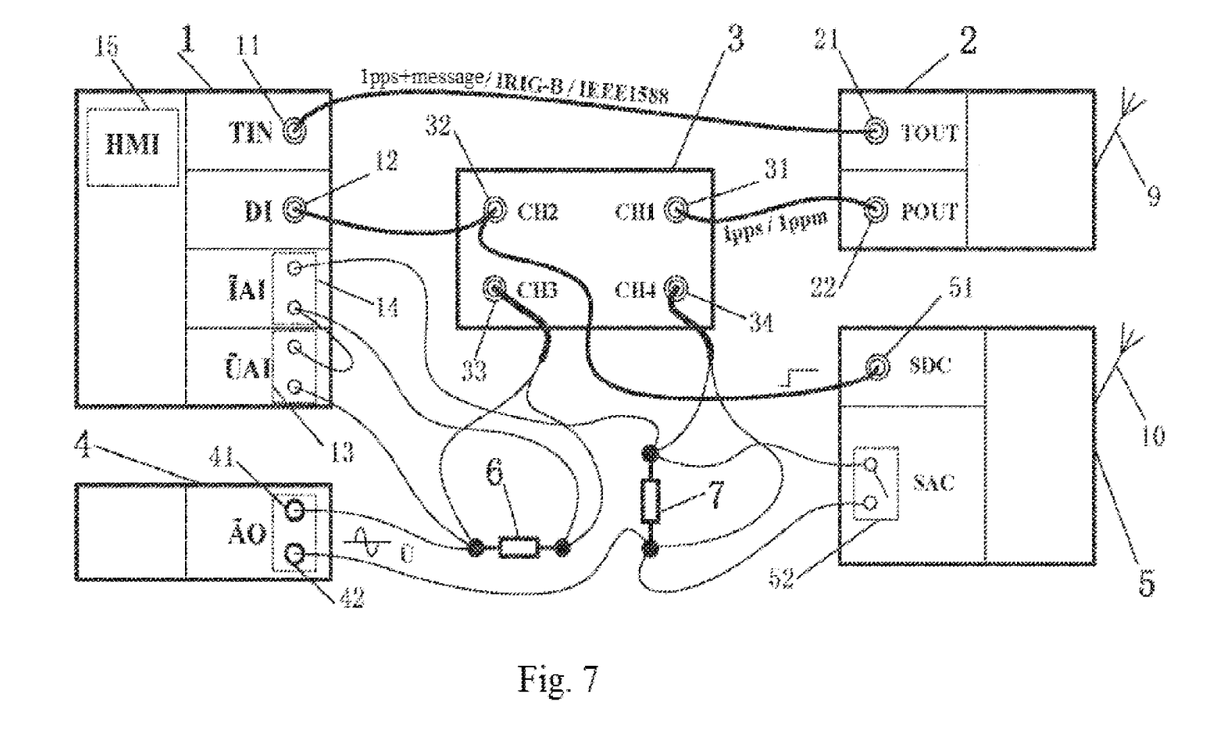
FIG. 7 is a sketch view of connections of devices which are provided by a method for detecting a time synchronization ability of a real-time measuring device based on a time variable according to the preferred embodiment of the present invention.
Figure 8:
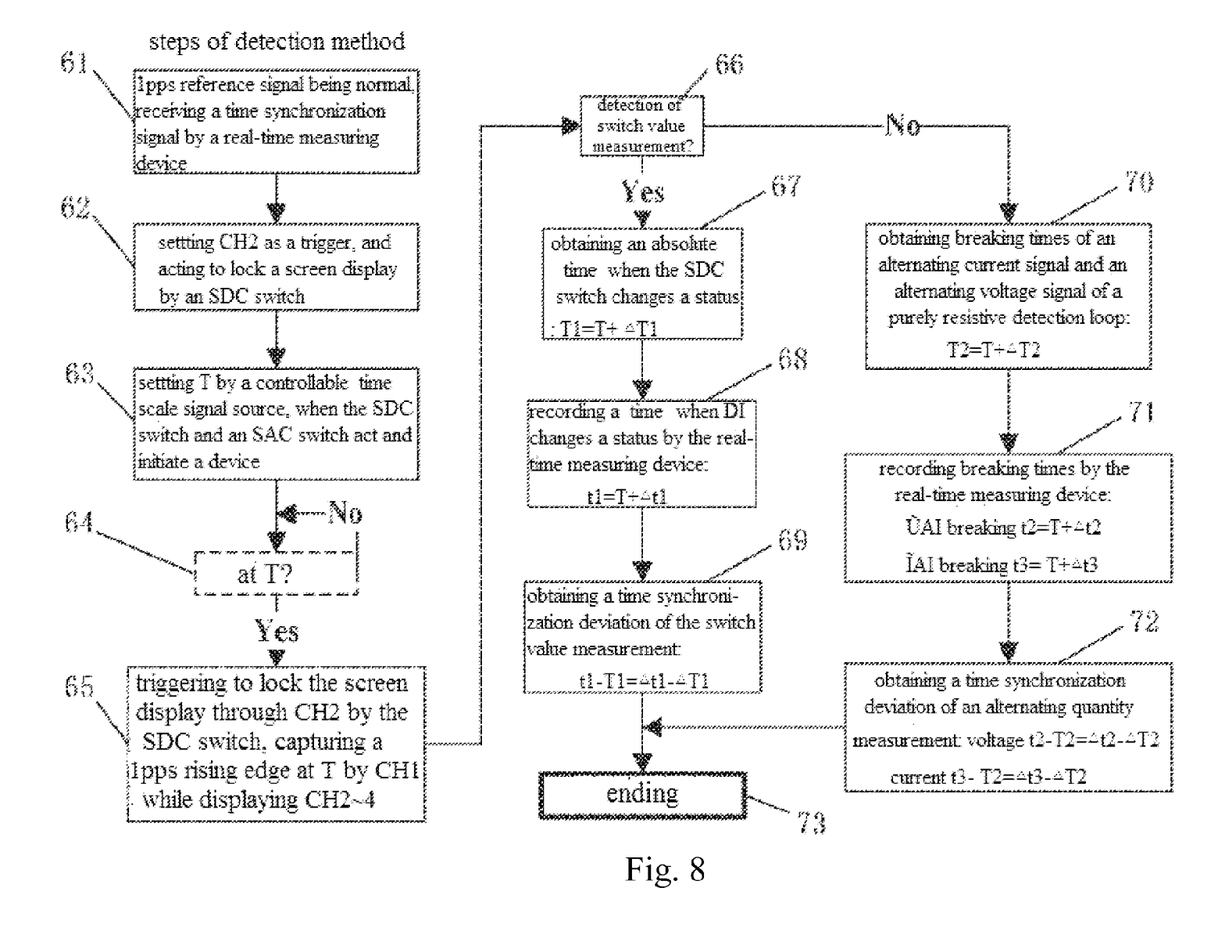
FIG. 8 is a flow chart of a detection process of the method according to the preferred embodiment of the present invention.

A method for detecting a time synchronization ability of a real-time measuring device, based on a time variable, comprises steps of:

firstly, connecting time synchronization signals, for preparing a detection of a time synchronization ability of a real-time measuring device; wherein as showed in FIG. 1, a standard satellite synchronous time service device 2 is not only a standard time signal source of a real-time measuring device 1, but also a time reference standard source of the method; the first step comprises steps of:

directly connecting a time synchronization signal output terminal 21 of the standard satellite synchronous time service device 2 to a time synchronous signal input terminal 11 of the real-time measuring device 1; connecting a pulse 1 pps signal output terminal 22 to a first sampling channel CH1 31 of an oscilloscope 3, and finishing a synchronization with a satellite time through a first satellite signal antenna 9 by the satellite synchronous time service device 2;

as showed in FIG. 2, the oscilloscope 3 detects a 1 pps waveform of the pulse 1 pps signal output terminal 22 through the first sampling channel CH1 31;

referring to FIGS. 1, 2 and 8, step 61 is for confirming that the first sampling channel CH1 31 of the oscilloscope 3 normally receives and detects a reference standard pulse 1 pps signal and checking that an HMI 15 of the real-time measuring device 1 normally confirms and receives a time synchronization TIN signal; the step 61 specifically comprises steps of:

a) detecting the 1 pps waveform of the pulse 1 pps signal output terminal 22 through the first sampling channel CH1 31, and confirming that the received pulse 1 pps signal is normal, by the oscilloscope 3;

b) checking that the HMI 15 of the real-time measuring device 1 displays time normally;

c) disconnecting the time synchronization signal input terminal 11 from the time synchronization signal output terminal 21;

d) changing a displayed time of the HMI 15 to be different from the satellite synchronization time service device 2, and confirming that the HMI 15 independently runs time normally;

e) re-connecting the time synchronization signal input terminal 11 to the time synchronization signal output terminal 21;

f) automatically recovering the displayed time of the HMI 15 to be identical to the satellite synchronization time service device 2; and g) finishing checking, and receiving the time synchronization signal of the satellite synchronous time service device 2 by the real-time measuring device 1;

secondly, detecting a time synchronization of a switch value measurement, comprising a step of:

as showed in FIG. 1, according to an application principle of a controllable switch which is disclosed by the Chinese patent 200820067196.6, controllable time scale signal source, and the Chinese patent 200810047989.6, method for detecting time information of output signals of satellite synchronization time service device, and further as showed in FIG. 3, providing a detection loop of a time synchronization ability of the switch value measurement, which specifically comprises steps of:

finishing a synchronization with the satellite time through a second satellite signal antenna 10 by the controllable time scale signal source 5; and connecting a switch value DI measuring signal input terminal 12 of the real-time measuring device 1, a second sampling channel CH2 32 of the oscilloscope 3 and a time controllable switch for detecting a switch value 51 of the controllable time scale signal source 5 in parallel; and further, as showed in FIGS. 1, 3, 4 and 8, comprising a step of: detecting a time synchronization deviation of the switch value measurement of a switch value time synchronization measuring ability, which specifically comprises steps of:

(step 61) confirming that the first sampling channel CH1 31 of the oscilloscope 3 normally receives and detects a reference standard pulse 1 pps signal, and checking that the HMI 15 of the real-time measuring device 1 normally confirms and receives the time synchronization TIN signal;

(step 62) setting the second sampling channel CH2 32 of the oscilloscope 3 as a triggering channel;

(step 63) setting a detection time T by the controllable time scale signal source 5 to be at a sharp minute or a sharp second when the time controllable switch for detecting the switch value 51 acts and initiates the controllable time scale signal source 5;

(step 64) waiting until T;

(step 65) at T, acting and triggering the oscilloscope 3 to lock a screen display thereof by the controllable switch 51, wherein the oscilloscope 3 is displaying a status of each sampling channel at T, and capturing a pulse rising edge of the reference standard pulse 1 pps signal at T according to the second sampling channel CH2 32 by the first sampling channel CH1 31, as showed in FIG. 4;

(step 67) through the first sampling channel CH1 31 and the second sampling channel CH2 32, obtaining an absolute time T1=T+ΔT1 when the time controllable switch for detecting the switch value 51 and the switch value DI measuring signal input terminal 12 change the statuses, wherein ΔT1 is a time deviation of the acting time of the switch 51 from T, as showed in FIG. 4;

(step 68) recording a time at which the switch value DI input signal changes the status t1=T+Δt1 by the HMI 15 of the real-time measuring device 1, wherein Δt1 is a time deviation of the switch value DI status changing time which is recorded by the real-time measuring device from T, as showed in FIG. 4;

(step 69) obtaining a time synchronization deviation of the switch value measurement of the real-time measuring device 1 t1−T1=Δt1−ΔT1, as showed in FIG. 4; and (step 73) ending;

thirdly, detecting a time synchronization of an alternating quantity measurement; wherein the third step comprises a step of: combined with FIGS. 1 and 3, according to the application principle of the controllable time scale switch, providing a purely resistive loop for detecting a time synchronization ability of the alternating quantity measurement as showed in FIG. 5, which specifically comprises steps of:

forming an alternating loop by connecting a first output terminal of an output interface ÃO 41 of an AC source 4 successively to a first purely resistive element 6, an alternating current ĨAI measuring signal input channel 14 of the real-time measuring device 1, a second purely resistive element 7 and a second output terminal of the output interface ÃO 42 of the AC source 4 in series; across the first purely resistive element 6, connecting an alternating voltage ŨAI measuring signal input channel 13 of the real-time measuring device 1 and a third sampling channel CH3 33 of the oscilloscope 3 to two ends of the first purely resistive element 6; connecting the time controllable switch for detecting an alternating quantity 52 of the controllable time scale signal source 5 and a fourth sampling channel CH4 34 of the oscilloscope 3 in parallel, then across the second purely resistive element 7 connecting the time controllable switch for detecting the alternating quantity 52 and the fourth sampling channel CH4 34 to two ends of the second purely resistive element 7;

the third step further comprises a step of: detecting a time synchronization deviation of an alternating voltage measurement and a time synchronization deviation of an alternating current measurement of a time synchronization measuring ability of the alternating quantity measurement, as showed in FIGS. 1, 3, 4, 5, 6 and 8, according to the application principle of the controllable time scale switch and a principle that an alternating voltage and an alternating current of a purely resistive loop share identical phase and change simultaneously, which specifically comprises steps of:

(step 61) confirming that the first sampling channel CH1 31 of the oscilloscope 3 normally receives and detects the reference standard pulse 1 pps signal, and checking that the HMI 15 of the real-time measuring device 1 normally confirms and receives the time synchronization TIN signal;

(step 62) setting the second sampling channel CH2 32 of the oscilloscope 3 as the triggering channel;

(step 63) setting the detection time T by the controllable time scale signal source 5 to be at a sharp minute or a sharp second when the time controllable switch for detecting the switch value 51 and the time controllable switch for detecting the alternating quantity 52 act simultaneously and then initiate the controllable time scale signal source 5;

(step 64) waiting until T;

(step 65) at T, acting and triggering the oscilloscope 3 to lock the screen display thereof by the controllable switch 51, wherein the oscilloscope 3 is displaying the status of each sampling channel at T, and capturing the pulse rising edge of the reference standard pulse 1 pps signal at T according to the second sampling channel CH2 32 by the first sampling channel CH1 31, as showed in FIG. 6;

(step 70) through the first sampling channel CH1 31, obtaining a voltage breaking absolute time of the two ends of the first purely resistive element 6 T2=T+ΔT2 which is captured by the third sampling channel CH3 33, and also a voltage breaking absolute time of the two ends of the second purely resistive element 7 T2=T+ΔT2 which is captured by the fourth sampling channel CH4 34, wherein ΔT2 is a time deviation of the acting time of the switch 52 from T; according to the principle of the purely resistive loop, obtaining signal breaking absolute times of the alternating voltage ŨAI measuring signal input channel 13 and the alternating current ĨAI measuring signal input channel 14 T2=T+ΔT2, as showed in FIG. 6;

(step 71) recording a breaking time of an alternating voltage ŨAI input signal t2=T+Δt2 by the HMI 15 of the real-time measuring device 1, wherein Δt2 is a time deviation of an alternating voltage ŨAI breaking time which is recorded by the real-time measuring device from T; and recording a breaking time of an alternating current ĨAI input signal t3=T+Δt3 by the HMI 15, wherein Δt3 is a time deviation of an alternating current ĨAI breaking time which is recorded by the real-time measuring device from T, as showed in FIG. 6; and (step 72) obtaining a time synchronization deviation of the alternating quantity measurement of the real-time measuring device 1, wherein the time synchronization deviation of the alternating voltage measurement t2−T2=Δt2−ΔT2 and that of the alternating current measurement t3−T2=Δt3−ΔT2, as showed in FIG. 6;

(step 73) end; and fourthly, detecting a time synchronization of the real-time measuring device; wherein the fourth step comprises a step of:

as showed in FIGS. 1, 3 and 5, providing a system for detecting the time synchronization of the real-time measuring device, which specifically comprises steps of:

respectively connecting the first and the second satellite signal antennae 9 and 10 into the standard satellite synchronous time service device 2 and the controllable time scale signal source 5; connecting the time synchronization signal output terminal 21 of the satellite synchronous time service device 2 to the time synchronous signal input terminal 11 of the real-time measuring device 1; connecting the pulse 1 pps signal output terminal 22 of the satellite synchronous time service device 2 to the first sampling channel CH1 31 of the oscilloscope 3; connecting an output terminal of the time controllable switch for detecting the switch value 51 of the controllable time scale signal source 5 to the switch value input terminal 12 of the real-time measuring device 1 and the second sampling channel CH2 32 of the oscilloscope in parallel; forming a purely resistive alternating detection loop by connecting the first output terminal of the output interface ÃO 41 of the AC source 4 to the first purely resistive element 6, the alternating current input channel 14 of the real-time measuring device 1, the second purely resistive element 7 and the second output terminal of the output interface ÃO 42 of the AC source 4 in series; across the first purely resistive element 6, connecting the alternating voltage input channel 13 of the real-time measuring device 1 and the third sampling channel CH3 33 of the oscilloscope 3 to the two ends of the first purely resistive element 6; connecting an output terminal of the time controllable switch for detecting the alternating quantity 52 of the controllable time scale signal source 5 and the fourth sampling channel CH4 34 of the oscilloscope 3 in parallel, and then across the second purely resistive element 7 connecting the output terminal of the time controllable switch for detecting the alternating quantity 52 and the fourth sampling channel CH4 34 to the two ends of the second purely resistive element 7;

the fourth step further comprises a step of: as showed in FIGS. 2, 4, 6, 7 and 8, according to the application principle of the controllable switch disclosed by the Chinese patent 200820067196.6, controllable time scale signal source, and the Chinese patent 200810047989.6, method for detecting time information of output signals of satellite synchronization time service device, and the principle that the alternating voltage and the alternating current of the purely resistive loop share the identical phase, obtaining the time synchronization of the real-time measuring device, which specifically comprises steps, as showed in FIG. 8, of:

(step 61) confirming that the first sampling channel CH1 31 of the oscilloscope 3 normally receives and detects the reference standard pulse 1 pps signal, and checking that the HMI 15 of the real-time measuring device 1 normally confirms and receives the time synchronization signal TIN;

(step 62) setting the second sampling channel CH2 32 of the oscilloscope 3 as the triggering channel;

(step 63) setting the detection time T, by the controllable time scale signal source 5, to be at a sharp minute or at a sharp second when the time controllable switch for detecting the switch value 51 and the time controllable switch for detecting the alternating quantity 52 act simultaneously to initiate the controllable time scale signal source 5;

(step 64) waiting until T;

(step 65) at T, acting and triggering the oscilloscope 3 to lock a screen display thereof by the controllable switch 51, wherein the oscilloscope 3 is displaying the status of each sampling channel at T, and capturing the pulse rising edge of the reference standard pulse 1 pps signal at T according to the second sampling channel CH2 32 by the first sampling channel CH1 31;

(step 66) executing the step 67 to detect the switch value, and executing the step 70 to detect the alternating quantity;

(step 67) through the first sampling channel CH1 31 and the second sampling channel CH2 32, obtaining the absolute time T1=T+ΔT1 when the time controllable switch for detecting the switch value 51 and the switch value measuring signal input terminal 12 change the statuses, wherein ΔT1 is the time deviation of the acting time of the switch 51 from T;

(step 68) recording the time at which the switch value input signal changes the status t1=T+Δt1 by the HMI 15 of the real-time measuring device 1, wherein Δt1 is the time deviation of the switch value status changing time which is recorded by the real-time measuring device from T;

(step 69) obtaining the time synchronization deviation of the switch value measurement of the real-time measuring device 1 t1−T1=Δt1−ΔT1, and executing step 73;

(step 70) through the first sampling channel CH1 31, obtaining the voltage breaking absolute time of the two ends of the first purely resistive element 6 T2=T+ΔT2 which is captured by the third sampling channel CH3 33, and also the voltage breaking absolute time of the two ends of the second purely resistive element 7 T2=T+ΔT2 which is captured by the fourth sampling channel CH4 34, wherein ΔT2 is the time deviation of the acting time of the switch 52 from T; according to the principle of the purely resistive loop, obtaining the signal breaking absolute times of the alternating voltage ŨAI measuring signal input terminal 13 and the alternating current ĨAI measuring signal input terminal 14 T2=T+ΔT2;

(step 71) recording the breaking time of the alternating voltage ŨAI input signal t2=T+Δt2 by the HMI 15 of the real-time measuring device 1, wherein Δt2 is the time deviation of the alternating voltage ŨAI breaking time which is recorded by the real-time measuring device from T; and recording the breaking time of the alternating current ĨAI input signal t3=T+Δt3 by the HMI 15, wherein Δt3 is the time deviation of the alternating current ĨAI breaking time which is recorded by the real-time measuring device from T;

(step 72) obtaining the time synchronization deviation of the alternating quantity measurement of the real-time measuring device 1, wherein the time synchronization deviation of the alternating voltage measurement $t2-T2=\Delta t2-\Delta T2$ and that of the alternating current measurement $t3-T2=\Delta t3-\Delta T2$; and (step 73) ending.

According to the controllable switch application principles disclosed by the Chinese patent 200820067196.6, controllable time scale signal source, and the Chinese patent 200810047989.6, method for detecting time information of output signals of satellite synchronization time service device, on a premise that the real-time measuring device correctly receives time service signals, the present invention provides the method for detecting the time synchronization ability of the power station real-time measuring device based on a control of the variable time, wherein the method involves the purely resistive loop comprising a value transferring device and a time controllable switch and aims at a detection purpose of the time synchronization signal application ability of the real-time measuring device.

The method relatively completely reflects the time synchronization signal application ability of the device, via a time synchronization performance of a measurement function of the real-time measuring device, and satisfies a requirement of value transfer. The method is an improvement in the power station time synchronization time service signals and the transmission accuracy detection; the method improves power station time synchronization detection procedures and facilitates improving real-time analysis and monitoring abilities of a power station and a power grid to a primary device and a primary system.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method for detecting a time synchronization ability of a real-time measuring device based on a time variable, comprising steps of:

providing a system comprising a real-time measuring device a standard satellite synchronous time service device, a multi-channel storage oscilloscope, an AC source and a controllable time scale signal source; and respectively connecting a first and a second satellite signal antennae into the standard satellite synchronous time service device and the controllable time scale signal source; connecting a time synchronization signal output terminal of the standard satellite synchronization time service device to a time synchronization signal input terminal of the real-time measuring device; connecting a pulse 1 pps signal output terminal of the standard satellite synchronous time service device to a first sampling channel of the oscilloscope; connecting an output terminal of a first time controllable switch SDC for detecting a first switch value of the controllable time scale signal source to a switch value DI input terminal of the real-time measuring device and a second sampling channel of the oscilloscope in parallel; forming a purely resistive alternating detection loop by connecting a first output terminal of an output interface of the AC source to a first purely resistive element, an alternating current input channel of the real-time measuring device, a second purely resistive element and then a second output terminal of the output interface in series; across the first purely resistive element, connecting an alternating voltage input channel of the real-time measuring device and a third sampling channel of the oscilloscope to two ends of the first purely resistive element; connecting an output terminal of a second time controllable switch SAC for detecting an alternating quantity of the controllable time scale signal source to a fourth sampling channel CH4 of the oscilloscope in parallel, then across the second purely resistive element connecting the output terminal of the second time controllable switch SAC for detecting the alternating quantity and the fourth sampling channel to two ends of the second purely resistive element;

detecting by the oscilloscope a time synchronization deviation of an alternating voltage measurement, $t2-T2$, and a time synchronization deviation of an alternating current measurement, $t3-T2$, of a to-be-detected alternating quantity time synchronization measuring ability;

detecting by the oscilloscope a time synchronization deviation of a switch value measurement, $t1-T1$, of a to-be-detected switch value time synchronization measuring ability.

2. The method, as recited in claim 1, the step of: detecting the time synchronization deviation of the alternating voltage measurement, $t2-T2$, and the time synchronization deviation of the alternating current measurement, $t3-T2$, of the to-be-detected alternating quantity time synchronization measuring ability, further comprising steps of:

confirming that the first sampling channel of the oscilloscope normally receives and detects a reference standard pulse 1 pps signal, and checking that a human-machine interface of the real-time measuring device normally confirms and receives a time synchronization signal;

setting the second sampling channel CH2 of the oscilloscope as a triggering channel;

setting a detection time T by the controllable time scale signal source to be at a sharp minute or at a sharp second when the first time controllable switch SDC for detecting the first switch value and the second time controllable switch SAC for detecting the alternating quantity act simultaneously to initiate the controllable time scale signal source;

waiting until the detection time T;

at the detection time T, acting and triggering the oscilloscope to lock a screen display thereof by the first time controllable switch SDC, wherein the oscilloscope is displaying a status of each sampling channel at the detection time T, and capturing a pulse rising edge of the reference standard pulse 1 pps signal at the detection time T according to the second sampling channel by the first sampling channel;

through the first sampling channel, obtaining a first voltage breaking absolute time of the two ends of the first purely resistive element $T2=T+\Delta T2$ which is captured by the third sampling channel, and a second voltage breaking absolute time of the two ends of the second purely resistive element $T2=T+\Delta T2$ which is captured by the fourth sampling channel, wherein $\Delta T2$ is a time deviation of an acting time of the second time controllable switch SAC from the detection time T; according to a principle of the purely resistive loop, obtaining signal breaking absolute times of an alternating voltage measuring signal input terminal and an alternating current measuring signal input terminal T2=T+ΔT2;

recording a breaking time of an alternating voltage input signal t2=T+Δt2 by the human-machine interface of the real-time measuring device, wherein Δt2 is a time deviation of an alternating voltage breaking time which is recorded by the real-time measuring device from the detection time T, and recording a breaking time of an alternating current input signal t3=T+Δt3, wherein Δt3 is a time deviation of an alternating current breaking time which is recorded by the real-time measuring device from the detection time T; and obtaining the time synchronization deviation of the alternating quantity measurement of the real-time measuring device, wherein a time synchronization deviation of the alternating voltage measurement t2−T2=Δt2−ΔT2; a time synchronization deviation of the alternating current measurement t3−T2=Δt3−ΔT2.

3. The method, as recited in claim 1, the step of: detecting the time synchronization deviation of the switch value measurement, t1−T1, of the to-be-detected switch value time synchronization measuring ability, further comprising steps of:

confirming that the first sampling channel of the oscilloscope normally receives and detects a reference standard pulse 1 pps signal, and checking that a human-machine interface of the real-time measuring device normally confirms and receives a time synchronization signal;

setting the second sampling channel of the oscilloscope as a triggering channel;

setting a detection time T by the controllable time scale signal source to be at a sharp minute or at a sharp second when the first time controllable switch SDC for detecting the first switch value act to initiate the controllable time scale signal source;

waiting until the detection time T;

at the detection time T, acting and triggering the oscilloscope to lock a screen display thereof by the first time controllable switch SDC, wherein the oscilloscope is displaying a status of each sampling channel at the detection time T, and capturing a pulse rising edge of the reference standard pulse 1 pps signal at the detection time T according to the second sampling channel by the first sampling channel;

through the first sampling channel and the second sampling channel, obtaining an absolute time T1=T+ΔT1 when the first time controllable switch for detecting the first switch value SDC and the switch value DI measuring signal input terminal change statuses, wherein ΔT1 is a time deviation of an acting time of the first time controllable switch SDC from the detection time T;

recording a time at which the switch value DI input signal changes a status t1=T+Δt1 by the human-machine interface of the real-time measuring device, wherein Δt1 is a time deviation of the switch value DI status changing time which is recorded by the real-time measuring device from the detection time T; and obtaining the time synchronization deviation of the switch value measurement of the real-time measuring device t1−T1=Δt1−ΔT1.

* * * * *